(12) United States Patent
Royan

(10) Patent No.: US 7,106,328 B2
(45) Date of Patent: Sep. 12, 2006

(54) PROCESS FOR MANAGING THE REPRESENTATION OF AT LEAST ONE 3D MODEL OF A SCENE

(75) Inventor: Jérôme Royan, Rennes (FR)

(73) Assignee: France Telecom, Paris (FR)

( * ) Notice: Subject to any disclaimer, the term of this patent is extended or adjusted under 35 U.S.C. 154(b) by 172 days.

(21) Appl. No.: 10/794,457

(22) Filed: Mar. 5, 2004

(65) Prior Publication Data

US 2005/0012742 A1    Jan. 20, 2005

(30) Foreign Application Priority Data

Mar. 7, 2003    (FR) .................................. 03 02897

(51) Int. Cl.
*G06T 17/00*    (2006.01)
(52) U.S. Cl. ...................... 345/428; 345/420
(58) Field of Classification Search ................ 345/420, 345/428
See application file for complete search history.

(56) References Cited

U.S. PATENT DOCUMENTS 5,963,209 A * 10/1999 Hoppe ......................... 345/419

OTHER PUBLICATIONS

Michael Kofler, Michael Gervautz, and Michael Gruber, "R-trees for Organizing and Visualizing 3D GIS Databases," Jul. 2000, Journal of Visualization and Computer Animation, vol. 11, No. 3, p. 129-143.*
Peter Lindstrom, David Koller, William Ribarsky, Larry F. Hodges, Nick Faust, Gregory A. Turner, "Real-time, Continuous Level of Detail Rendering of Height Fields," Aug. 1996, Proceedings of the 23rd Annual Conference on Computer Graphics and Interactive Techniques, p. 109-118.*
Peter Lindstrom, David Koller, William Ribarsky, Larry Hodges, Augusto Op den Bosch and Nick Faust, "An Integrated Global GIS and Visual Simulation System," Mar. 1997, Report GIT-GVU-97-07, Graphics, Visualization, and Usability Center, Georgia Tech.*
Helmut Mayer, "Three Dimensional Generalization of Buildings Based on Scale-Spaces," 1998, Technical Report, Chair for Photogrammetry and Remote Sensing, Technische Universitat Munchen.*
Gill Barequet, Micha Sharir, "Filling Gaps in the Boundary of a Polyhedron," Mar. 1995, Computer Aided Geometric Design, vol. 12, No. 2, Elsevier Science, p. 207-229.*
Douglas Davis, William Ribarsky, T. Y. Jiang, Nickolas Faust, Sean Ho, "Real-Time Visualization of Scalably Large Collections of Heterogeneous Objects," Oct. 1999, Proceedings of the Conference on Visualization '99: Celebrating Ten Years, p. 437-440.*

(Continued)

*Primary Examiner*—Ulka Chauhan
*Assistant Examiner*—Jason M. Repko
(74) *Attorney, Agent, or Firm*—Blakely Sokoloff Taylor & Zafman

(57) ABSTRACT

Process for managing the representation of at least one model of a scene including buildings intended to be transmitted to a client. The scene is modelled by a multi-scale tree-structured representation. Different nodes are associated with the different levels of details of the scene. These different nodes are dependent on each other in a tree structure in which at least one son node is defined by information known by a father node and by additional information in respect of the son node. A processing operation to simplify the representation is applied to the modelling and priorities for implementing the simplification processing operations are determined by a cost function which takes account of the criterion of the difference in height of the merged buildings.

11 Claims, 4 Drawing Sheets

OTHER PUBLICATIONS

"Simplification Envelopes", J. Cohen, et al., Dept. of Computer Science, Univ. of North Carolina, State University of New York, Duke University, pp. 1-19.

"Multi-layered impostors for accelerated rendering", X. Decoret, et al., the Eurographics Association and Blackwell Publishers 1999. vol. 18, No. 3, 7 pages.

"Surface Simplification Using Quadric Error Metrics", M. Garland, Carnegie Mellon Univ. 4 pages.

"Simplifying Sufaces with Color and Texture using Quadric Error Metrics", M. Garland, et al, Carnegie Mellon Usiversity, 1998 IEEE, p. 263-542.

"View-Dependent Refinement of Progressive Meshes", H. Hoppe, Microsoft Research, 5 pages.

"Progessive Meshes", H. Hoppe, Microsoft Research, p. 99-108.

"New Quadric Metric for Simplifying Meshes with Appearance Attributes", H. Hoppem Microsoft Research, 4 pages.

"View Dependent Simplification of Arbitrary Polygonal Environments", D. Luebke, et al., Dept. of Computer Science, University of N. Carolina, 5 pages.

"Procedural Modeling of Cities", Y. Parish, 4 pages.

"Surfels: Surface Elements as Rendering Primitives", H. Pfister, et al., MERI, Cambridge MA, 4 pages.

"Decimation of Triangle Meshes", W. Schroeder, et al., General Electric Company Schenectady, NY, 3 pages.

"Visibility Preprocessing For Interactive Walkthroughs", S. Teller, Computer Science Department, Berkeley, CA, 5 pages.

NEXUS-Distributed Data Managment Concepts for Location Aware Applications, S. Volz, et al., pp. 1-15.

"Point Based Impostors for Real-Time Visualization", M. Wimmer, et al., iMagis-Gravir/IMAG-INRIA, Vienna University of Technology, 8 pages.

"Occluder Shadows for East Walkthroughs of Urban Environments", P. Wonka, et al, Eurographics '99/, vol. 18, 1999, No. 3, 5 pages.

Instant Visability, Eurographics 2001/A. Chalmers and T-M. Rhyne, vol. 20, No. 3, 6 pages.

"Visability Preprocessing with Occuluder Fusion for Urban Walkthroughs", P. Wonka, et al, Vienna University of Technology, pp. 1-12.

"Modeling and Visualizing the Cultural Heritage Data Set of Graz", C. Zach, et al., XP-002259175, International Symposium on Virtual Reality, Archeology and Cultural Heriage, 5 pages.

"Automatically Generating Roof Models from Building Footprints", R. Laycock, et al, Feb. 3, 2003, 3 pages.

"r-trees for visualizing and organizing large 3D gis databases-dissertation", M. Kofler, Jul. 1, 1998, pp. 1-164-XP002259173.

"Generalization of 3D Building Data", F. Thiemann, XP-002259174, pp. 1-5.

* cited by examiner

Classic cases

a, Elimination of a vertex

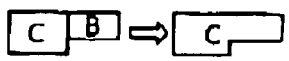
b, Merging of buildings connected by an edge

c, Merging of buildings not connected by an edge

Special cases handled

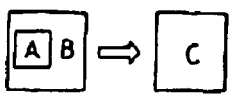
d, Merging of buildings connected by an edge

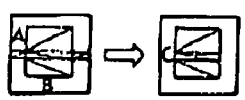
e, Merging of buildings not connected by an edge

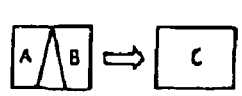
f, Merging of buildings not connected by an edge

Special cases not handled

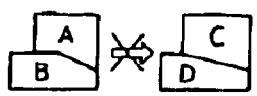
g, Elimination of a vertex impossible it belongs to another building

h, Triangulation not lending itself to the fusion of A and C but of A and B

FIG.3

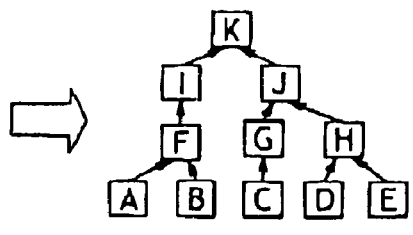

List of potential simplifications ordered according to their cost ⇒ Building tree

Sequence of overall floor dimensions of builgings forming the progressive representation

FIG.4

PROCESS FOR MANAGING THE REPRESENTATION OF AT LEAST ONE 3D MODEL OF A SCENE

BACKGROUND OF THE INVENTION

The present invention relates to the representation of at least one 3-D model of a scene.

It is particularly advantageous when applied to transmitting and visualising buildings via the network.

GENERAL TECHNICAL FIELD

Over recent years, several techniques have made it possible to model vast urban environments automatically from 2D½ informations. Among these techniques may be cited image segmentation combined with methods derived from photogrammetry, which allow the altitude, height, and roof type of a building to be determined from a video or from aerial photographs, or again the use of geographical information systems (cadastral maps, aerial images, etc.). From this 2D½ representation, comparable to a series of parameterisable prisms, a 3D model is reconstructed, allowing navigation within this city. Other methods using laser scanners provide 3D models of cities that are much more detailed, but have the drawback of providing a multitude of unstructured elements (due to occlusion problems), and are therefore difficult to use.

Given the growing complexity of virtual city models, it is impossible to transmit rapidly to the customer and to render in real-time the totality of a 3D model of an urban scene (several hundred thousand buildings for a city like Paris). Consequently, the "download and play" paradigm used nowadays for VRML browsers is unrealistic for scenes of this kind. However, various techniques have been perfected to allow navigation at ground level in vast urban environments, but very few offer the possibility of flying over the city with a significant depth of field. This overflying constraint is important, but is not the only one Compression: The 3D model of a city like Paris is very bulky (+8Go), which prevents it being transmitted over the network in a short time. The data transmitted to the customer must therefore be compressed, if the information allowing him to navigate in the city is to be transmitted in the shortest possible time.

Progressiveness: It is essential for the customer to have direct access to the navigation as soon as he is connected to the server. The city model then visualised is crude, but is at least present. This model must then be progressively refined, reducing as far as possible the redundant information transmitted on the network.

Local awareness: When connected to the server, the customer has no overall knowledge of the model (Most 3D network applications, like a number of games, do not under any circumstances transmit the geometry of the scene, since the latter is already present at the customer end). In our case, the customer does not under any circumstances have to download the scene fully before being able to visualise it, but he must have the opportunity to navigate as soon as he is connected to the server.

Adaptability: scene refinement must be carried out as a priority in the area near the viewpoint, and must be reversible.

One purpose of the invention is to offer a new representation of buildings in a virtual city, allowing a progressive transmission of the urban scene. This representation is multi-scale, thus allowing only the details perceptible in respect of a given observer viewpoint to be transmitted to the customer.

PRIOR ART

Several techniques have already been proposed to allow complex urban models to be visualised locally, but very few are adapted to visualising realistic urban scenes on the network.

1. Impostors

To restrict the geometry to be displayed by the graphics board, one solution consists in using a hybrid rendering associating geometric and image-based representations. In this way, for all objects in scenes close to the viewpoint, their geometric representations are transmitted to the graphics board. For objects that are distant from the viewpoint, an image-based representation is used. Each image-based representation is associated with an area containing the viewpoint (view cell). The images or impostors associated with a view cell are obtained by projecting the distance geometry on planes surrounding the view cell. The problem posed by this technique is the appearance of artefacts due to the parallax effects generated by perspective projection. To overcome this problem, the solution of multiple meshed impostors allows these appearances of artefacts [2] to be restricted. Another solution is to use point-based impostors, where the image is represented by a series of 3-D points [14]. However, all the image-based representations have the drawback of being too bulky for transmission on the network (expensive image, mesh, or multi-point transfers).

2 Point-Based Rendering

In order to process only points, and no longer triangles, point-based rendering uses a representation that is not polygonal, but a representation constituted by a series of points (surfels) without explicit connectivity, with which different depth, colour, surface normal, etc. attributes are associated [10]. The advantage of this representation is the speed of processing operations performed during the 3-D rendering phase given the simplicity of the primitives. It is necessary for at least one point to be projected on each pixel. In the contrary event, smoothing is applied in order to fill the empty pixels.

This technique is highly appropriate for objects with complex curvatures, and for which the distance from the viewpoint to the object relative to its size is quite significant. In the case of navigation at ground level in a city, the distance from the viewpoint to the buildings relative to the size of the buildings is quite small. Moreover, a building is constituted by very few polygons (facades+roof), and the mapped textures are quite detailed. To obtain good results with a point-based representation, a very high resolution of surfels would be required for each building. Given the large number of buildings in a city, the size of the city database in point-based representation would be much too bulky to be stored on the server and transmitted to the customer.

3 Conservative Visibility

The purpose of this technique is to restrict the geometry transmitted to the graphics board, calculating the geometry visible from a certain viewpoint, or an area (view cell). When navigating at ground level in a city, the majority of the buildings near the viewpoint mask the buildings further away. Thus, the number of visible buildings is very limited relative to the number of the buildings in the scene, and only those buildings will be transmitted to the graphics board.

Some techniques allow the calculation in real-time of these series of objects potentially visible from a certain viewpoint (PVS) by using the graphics material [15] [16]. In the case of a customer-server application, only the server has overall knowledge of the scene, and it is therefore on the server side that the PVS calculations will have to be made, which would give very unsatisfactory results in the event of a large number of customers being connected.

Another solution is to pre-calculate these objects potentially visible from a given area (view cell). Indeed all that needs to be done is to partition the navigable 2D½ space of the urban scene into view cells, and to calculate all the objects potentially visible from these view cells [12] [17]. In the case of a network application, the customer has only to transmit his position to the server, which determines the corresponding view cell, and transmits the geometry visible from it. The server has no further occlusion calculation to make, but tends to play the role of a structured database responding to customer requests.

However, in the case of overflying urban scenes, the great majority of the buildings in a city are visible, and therefore the more the altitude of the viewpoint increases, the larger the PVS associated with the viewpoint become. This technique of conservative visibility is therefore adapted to ground level navigation, but cannot be used for overflying cities.

4 Level of Details

The size of an object in the image in the case of a perspective projection depends entirely on its real size in 3D space, and on its distance relative to the viewpoint. Thus, the further the object is from the viewpoint, the smaller it will be in size in the image. In fact, preserving the complex geometry of an object constituted by a large number of polygons is pointless in the event of its projection in the image covering only a few pixels. This is why it may be advantageous to propose several representations of the same 3D object with different resolutions: the level of detail.

Most simplification methods apply to meshed objects [1] [3] [4] [11], or are carried out manually when modelling 3-D objects (for example when modelling buildings). To decimate a mesh, successive atomic actions are applied like edge contraction or vertex elimination while getting as close as possible to the original surface. It is possible to obtain a progressive multi-scale representation by using a tree structure [6] [5] [7] [8], where each node of the tree corresponds to an atomic action applied to the mesh. This multi-scale representation is in this case progressive and reversible, and selecting the nodes to be developed can in this case depend on the viewpoint.

Except that a city building cannot be considered as a meshed object, but rather as a restricted series of polygons. Moreover, it is not conceivable to apply simplifications to buildings taken one by one, but rather to the city in its entirety. The University of Stuttgart's urban navigation platform Nexus uses the static levels of details for the buildings, but does not offer a progressive and dynamic multi-scale representation of a city [13].

5 Procedural Models

Another solution is to model the city in a procedural way using techniques derived from L-systems [9]. From a certain number of parameters, such as population density distribution, general street orientation, building area specification, it is possible to model a city automatically. The advantage for a customer/server application is the small amount of information to be transmitted in order to obtain a city model. The drawback of this representation is the lack of realism of the 3D model of the city.

BRIEF SUMMARY OF THE INVENTION

The present invention proposes a multi-scale representation of the buildings of a city which is progressive, which can be viewpoint dependent, and not bulky, in order to allow urban navigation in overflight on a customer/server system. This invention is not only restricted to the representation of buildings, but allows all 3D models of scenes to be represented from a series of prisms.

Cities consisting of several hundred thousand buildings need to be modelled automatically, in order to reduce production costs. As is disclosed above, these automatic modelling methods are often based on a 2D½ representation of the buildings. It is therefore advantageous to preserve this 2D½ representation of the city, representing a much less significant volume of data than the corresponding 3-D representation (compression rate of 1:10). This multi-scale and progressive 2D½ representation of the scene will be transmitted to the client, who will have to take over the corresponding 3-D reconstruction.

Let us remember that this representation observes, in the context of network use, the following constraints
  Compression: Making it possible to transmit the information needed for the 3D reconstruction of the buildings in as short a time as possible on low-bit-rate networks.
  Progressiveness: Making it possible to have a maximum number of levels of detail, limiting breaks in the image caused by transferring from one level to the next. Moreover, the redundancies between the different levels of detail are reduced, since only the necessary information allowing the scene to be refined will be transmitted (unlike static levels of detail which retransmit the totality of the objects at different resolutions without exploiting the previous levels of detail).
  Local awareness: when connected to the server, the client has no overall knowledge of the model. In our case, the customer has no need to download the scene in its entirety before visualising it, but he is able to navigate as soon as he is connected to the server.
  Adaptability and viewpoint dependence: scene refinement must be carried out as a priority in the area near the viewpoint, and must be reversible. The speed of scene refinement depends on the network bit rate, and thus the larger the bit rate, the faster the scene is updated.
  Overflying: Making it possible to navigate in the zones, unlike solutions offered by conservative visibility methods.

To this end, the proposal is to represent all the multi-scale prisms represented in 2D½ using a tree structure. These prisms are not connected; we thus depart from the context of the simplification of 3-D meshes stored in the form of a "vertex tree" [8], [5]. The purpose of the simplifications made will be to reduce the number of vertices defining the prisms by eliminating vertices or fusing prisms.

In this way, the invention proposes a process for managing the representation of at least one model of a scene including buildings intended to be transmitted by storage means to a client, said scene being modelled by a multi-scale tree-structured representation, in which different nodes are associated with the different levels of details of the scene, these different nodes being dependent on each other in a tree structure in which at least one son node is defined by information known by a father node and by additional informations, the information stored by the storage means in respect of the son node being these additional informations, characterised in that a processing operation to simplify the representation is applied to the modelling and in that priorities for implementing the simplification processing operations are determined by determining a cost function which takes account of the criterion of the difference in height of the fused buildings Said storage means may be a server or any-other equivalent storage means (CD-ROMs, for example).

BRIEF DESCRIPTION OF THE DRAWINGS

FIG. 3 shows an example of simplifications;

FIG. 4 shows a principle of the algorithm for generating a progressive city representation;

DETAILED DESCRIPTION OF THE INVENTION

In this section is given the 2D½ informations representing all the buildings provided by most of the algorithms for modelling a city automatically, thus allowing the progressive multi-scale representation implemented to be specified.

Then the algorithm is given that allows this progressive multi-scale representation to be generated.

Lastly, we propose an example of use of this representation on a visualisation and navigation system in vast urban environments on networks.

1 2D½ Representation of Buildings in a City

A city cannot be modelled manually given the substantial number of buildings of which it is made up. Most automatic city modelling techniques make it possible, from 2D½ information (videos, photographs, cadastral maps, etc), to extract the necessary 2D½ information allowing the 3D model of the city to be reconstructed by extrusion (segmentation of the image determining the overall floor dimensions of the buildings and techniques derived from photogrammetry providing their altitudes and their heights). Thus, the buildings in a city can be represented as being a series of overall floor dimensions of buildings, with which different parameters are respectively associated such as their height, their altitude, their facade texture, their roof type, etc. The 2D½ representation of the city buildings is much more adapted to transmitting a city on the network (just the 2D½ vertices of the overall floor dimensions of the buildings and the parameters allowing 3D modelling), thus offering a rate of compression of 1:10 relative to the corresponding 3D representation. However a 3D modelling phase is therefore necessary at the customer end in order to transmit the geometry of the buildings to the graphics board.

However, this 2D½ representation has to observe a few topological constraints in order to apply the simplifications more easily:

a set of overall floor dimensions of a building cannot be intersected nor intersect another building;

a set of overall floor dimensions of a building can only touch another by "sharing" common segments (tangential points prohibited).

no duplication of vertices defining the overall floor dimensions of buildings.

The databases generated from 2D½ information do not always observe these constraints, which is why automatic correction tools have been implemented in order to correct them (intersection tests, correction interface, etc.).

2 Multi-Scale Progressive Representation of the Buildings in the City 2.1 Context Let S be all the vertices in $R^2$ of our scene represented in 2D½, and let P be belonging to $S^n$ the series of representable polygons from the series S. The set of overall floor dimensions of the buildings in our scene is defined as BFP E P. The idea will therefore be to apply a simplification sequence to BFP:

$$(\widetilde{BPF} = BFP^n) \xrightarrow{simpl_{u-1}} \ldots \xrightarrow{simpl_1} BFP^1 \xrightarrow{simpl_{JI}} BFP^u \quad (1)$$

Given that each simple is reversible, the process is too.

Figure 1:
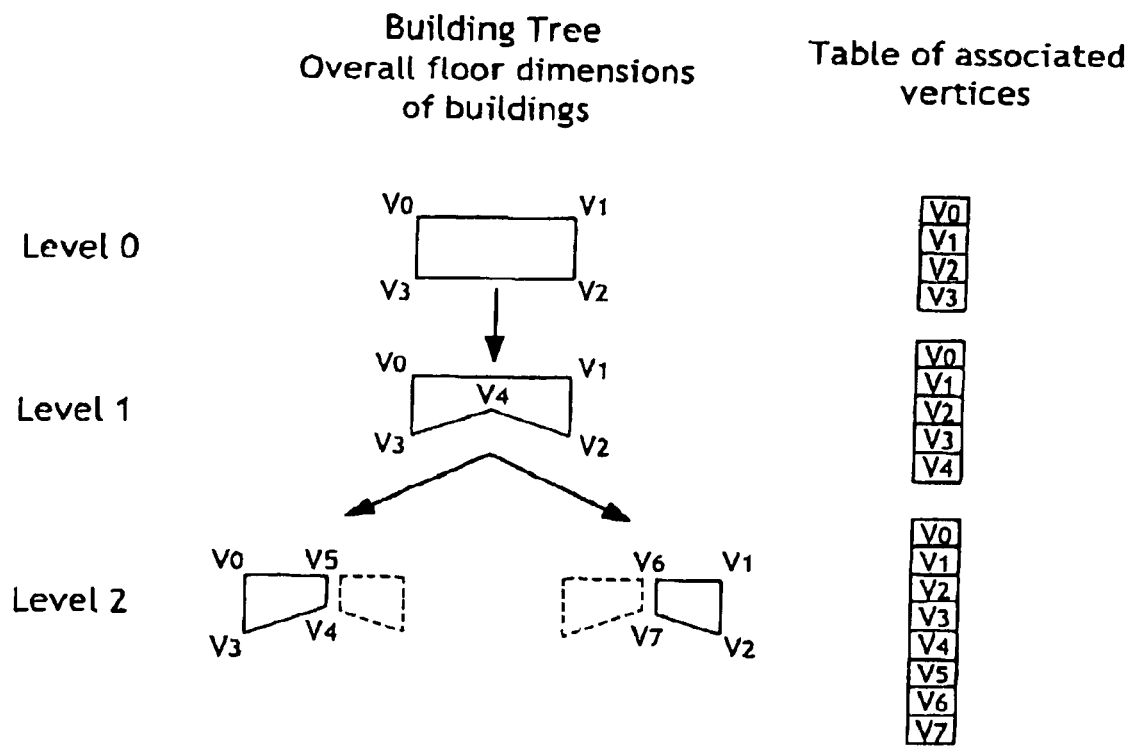
FIG. 1 is a representation of the levels of detail using a polygonal tree.

The tuple (BFPo) forms a progressive and multi-scale representation of BFP. Each dvlp development introduces the addition of vertices and the modification of some overall floor dimensions of buildings (see FIG. 1). The tuple ({bfpi, to bfpi,+1}, bfpj) defines a simplification simplk__1 where fbfpi, to bfpi+, 1,J represents the overall floor dimensions of buildings belonging to $BFP^k$ and b f pj the corresponding simplified building belonging to $BFP^{k-1}$.

Respectively, the tuple (bfpj, {bfpi, to bfpi+$_m$}) represents a development dvlpk.

The resulting sequence of overall floor dimensions of buildings BFPo, to BFpn is particularly well adapted to selecting a viewpoint dependent level of detail. Additionally, it may be conceivable to use geomorphs to obtain visually more homogeneous transitions between the different levels of detail.

2.2 Multi-Scale Representation

The multi-scale representation of buildings in a city is based on a tree structure containing the fusions and simplifications of the buildings, the Building tree. With this tree is associated a table of vertices defining the overall floor dimensions of buildings associated with the nodes of the Building tree (called Building Nodes). The advantage of the Building tree lies in the storage of non-redundant information between the different nodes, and in a conceivable progressive transmission from this representation. Indeed, to develop a father node of the Building tree, it is not necessary to store the totality of the information allowing the son nodes to be represented, but only the additional information which, from the information already known by the father node allows the son nodes to be determined. Also, to prevent any transmission to the customer of vertices that are pointless in respect of the remainder of the development of the Building tree, any vertex defining the overall floor dimensions of a node of the Building tree defines the overall floor dimensions of at least one of these son nodes (see FIG. 1). Each Building node must contain a 2D½ representation allowing a 3-D modelling of the building which is associated with it. Thus a Building node must be specified as follows:

a reference, an overall floor dimension (polygon indexed relative to the table of vertices), a height, an altitude, a roof type, any other parameters allowing the 3D geometry of the building to be modelled in a procedural way, the references to the father node and the son nodes.

This representation of the buildings of a city in the form of a Building tree allows the details that are actually perceptible for a given viewpoint to be transmitted to the customer. Indeed, in accordance with different criteria like the distance from the viewpoint to a building represented by a Building Node, the server may decide to transmit the necessary information allowing the customer to develop it, and therefore to display a more refined model of the building. The server is aware of the totality of the Building tree (whose leaves represent the buildings provided at input of the algorithm), whereas the customer is aware of only one part of the Building tree. This representation in the form of a tree structure introduces a constraint to the process of generating levels of details. Indeed with each simplification made, one and only one building node is perhaps generated (see the particular case g in FIG. 3):

$$\forall k, \exists i,j \backslash i \neq j, bfp_i \in BFP^{k-1}, bfp_j \in BFP^{k-1}, bfp_i \notin BFP^k, bfp_j \notin BFP^k \quad (3)$$

Thus, a simplification of one or more buildings generates only one building.

3 Generating the Progressive Multi-Scale Representation 3.1 Conceivable Simplifications The conceivable simplifications allowing the complexity of the city to be reduced are as follows Reducing the number of facades of a building: This is carried out by eliminating a vertex from the overall floor dimensions of the building, and verifies these constraints:

A single vertex is eliminated with each reduction in the number of facades of a building, moreover this vertex must not be shared by another overall floor dimension of a building.

$$\forall simpl(\{bfp_i\}, bfp_j) \text{ with } bfp_i \in BFP^k \text{ and }$$
$$bfp_i \in BFP^{k-1} \text{ then } \exists 1v \in bfp_i \backslash v \notin bfp_j. \text{ moreover}$$
$$\exists 1 \backslash 1 \neq i, v \in bfp_1 \text{ with } bfp_1 \in BFP^k \quad (4)$$

Eliminating the vertex must not generate intersections between the simplified building and the neighbouring buildings.

$$\forall k, \forall bfp_i, bfp_j \in BFP^k, i \neq j \Rightarrow bfp_i \cap bfp_j = \emptyset$$

The area of the overall floor dimensions of the simplified building must be closest to the area of the overall floor dimensions of the original building.

$$\forall simpl(\{bfp_i\}, bfp_j), \exists 1v_1 \in bfp_i, v_1 \notin bfp_j \Rightarrow \forall v_2 bfp_i,$$
$$v_1 \neq v_2, \text{ area}(bfp_j) = \text{area}(bfp_i - (v_1)) \leq \text{area}(bfp_1 - \{v_2\}) \quad (6)$$

Merging two buildings connected by one facade: This is carried out by merging the overall floor dimensions of the two buildings. The height of the resulting building is an average of the height of the two buildings weighted by their respective surface areas, and the altitude is the minimum altitude of the two original buildings, thus ensuring that the building generated is mapped to the ground:

$$\begin{cases} \text{altitude}(bfp_k) = \text{MIN}(\text{altitude}(bfp_i), \text{altitude}(bfp_j)) \\ \text{height}(bfp_k) = \frac{\text{height}(bfp_i) = \text{area}(bfp_i) + \text{height}(bfp_j) + \text{area}(bfp_j)}{\text{area}(bfp_i) = \text{area}(bfp_j)} \end{cases} \quad (7)$$

Figure 2:
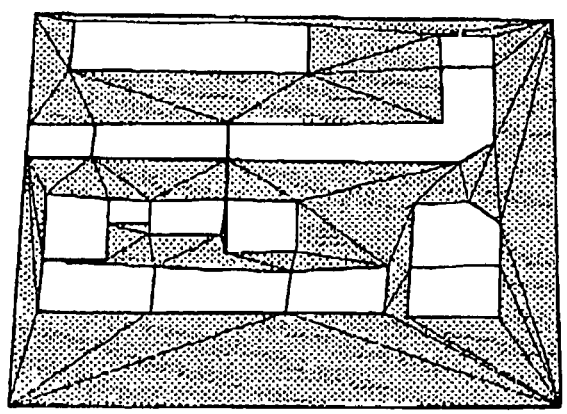
FIG. 2 shows an example of triangulation constrained by the overall floor dimensions of the buildings.

Merging two unconnected buildings: This simplification is much less implicit than the two previous ones. To determine the potential fusion of buildings unconnected by an edge, a triangulation of the empty space is carried out without a Steiner point (the vertices of the triangles belong to the V series, and therefore the triangulation is not Delaunay, see FIG. 2). Thus, we obtain a meshing composed of the overall floor dimensions of the buildings and of the triangles derived from the triangulation of the empty space, which provides us with a comprehensive topology of the scene. Two unconnected buildings can only be fused so long as there are triangles that share a vertex with each of the two buildings, and which are connected by an edge to at least one of the buildings (see FIG. 3). The altitude and the height of the building generated always follows equation 7. It should be noted that this method of determining possible fusions between unconnected buildings is not restrictive. Other methods, such as the search for the edges of the overall floor dimensions of the nearest buildings are conceivable, or the expansion of these overall floor dimensions. Except that, the purpose is to restrict the number of vertices added in order to specify the fusions of the buildings (vertices which might be impertinent for more refined levels of detail).

FIG. 3 shows us different cases of possible simplifications. Using triangulation allows the particular cases e and f to be resolved, but has the drawback of not taking account of all possible simplifications, as in the case h (this quite rare case in no way blocks the simplification process, but it does not allow the nearest buildings to be simplified as a priority). As for case g, this is impossible, since it does not verify the constraint posed by equation 3.

3.2 Simplification Algorithm

The simplification algorithm takes at input all the buildings represented in 2D½, so as to generate the corresponding building tree. The algorithm is initialised by assigning all the input buildings to the leaves of the building tree, and by searching for all potential simplifications. Except that, in order to determine which simplification is to be made as a priority, a cost function is assigned to them. This cost function must take account of the following different criteria:

The difference in height of the merged buildings (diff-height), so as to merge as a final priority, for example, a tower neighbouring a small residence.

The difference in altitude of the merged buildings (diff-altitude), so as to merge as a final priority, for example, a building located at the foot of a cliff, with its neighbour located on top of the latter.

The additional surface area generated by the merging (area), since the larger the surface area is, the more visible this merging will be when visualised, leading to popping effects.

The minimum distance between the merged buildings (dist-min) allows streets to be preserved during the simplification process. This distance is indirectly taken into account by the additional surface area generated but, in the event of a fusion (merging) of two buildings covering a small surface area and quite distant from each other (two huts on either side of a street), the additional surface area generated is quite small, but the preservation of the streets is broken. The simplification which is carried out as a priority is the one with the smallest cost, knowing that the cost function must respect this property:

$$minimisecost(diff\_height, diff\_altitude, dist\_min, area) \qquad (8)$$

$$\begin{cases} Minimise diff\_height \\ Minimise diff\_altitude \\ Minimise dist\_min \\ Minimise area \end{cases}$$

The cost function used in our implementation is as follows:

$$cost(diff\_height, diff\_altitude, dist\_min, area) = area \times e^{\alpha \times diff\_height + \beta \times diff\_altitude + \gamma \times dist\_min} \qquad (9)$$

where $\alpha$, $\beta$, $\gamma$ are scalars allowing the different parameters diff_height, diff_altitude, dist_min, area to be taken more or less into account.

Thus, throughout the operation of the algorithm, a list of potential simplifications ordered in accordance with their costs is kept up-to-date. With each iteration, the first list simplification is carried out, as well as an update of the building tree and of the potential simplifications list (see FIG. 4). In fact, applying a simplification may affect a number of potential simplifications. This updating of the list of potential simplifications must be made locally. Various circumstances may disturb this list when applying a simplification:

Elimination of a vertex. In this case, the potential simplifications and the triangles concerned by this vertex are updated;

Elimination of triangles during a simplification of unconnected buildings. Likewise, an update is carried out exclusively on the potential simplifications concerned by these eliminated triangles.

The algorithm is ended when all the buildings have been fused, in other words, when the list of potential simplifications is empty.

4 Network Application Envisaged

4.5 Overall View

Figure 5:
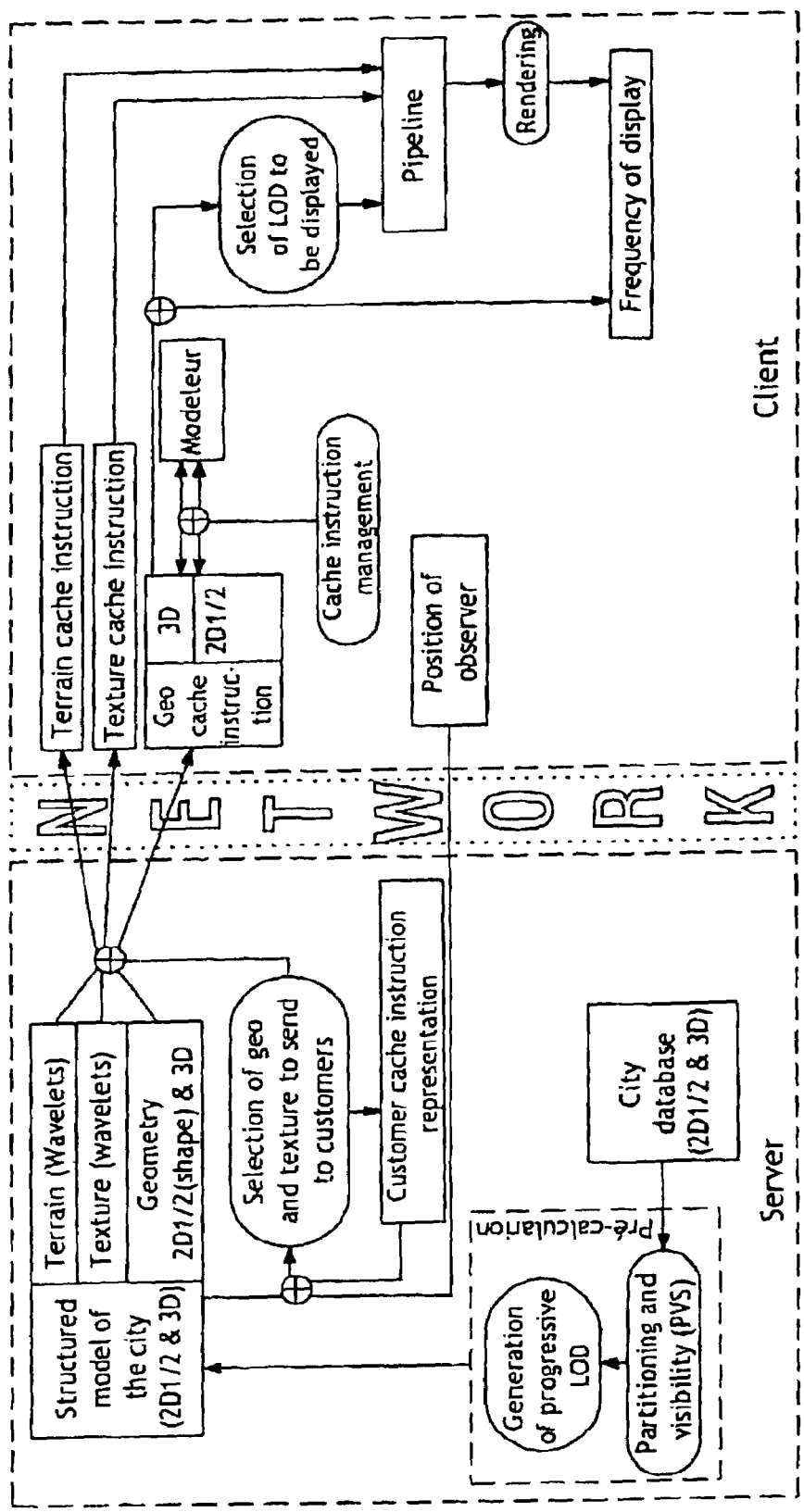
FIG. 5 shows a model of a time navigation customer server in an urban environment.

A complete model of the customer/server system is shown in FIG. 5. We show only the part involving the transmission and visualisation of the geometry of the buildings using the Building Tree, without giving detail on the modules relating to the terrain and the textures. As far as selecting the nodes of the building tree that have to be refined at the customer end are concerned, several modes are possible:

PULL mode: The customer himself decides on the nodes that have to be developed and sends a request to the server (index of the node for development), so that the latter provides him with the information necessary for the development of the node (new vertices, and the indices of the vertices constituting the new buildings). Since the process of selecting the nodes for development is carried out at the customer end, the server has only one role left, to respond to requests from customers by transmitting the information necessary for the development of the nodes. Thus, it is conceivable to connect a large number of customers to the same server.

PUSH mode: The server preserves the context of each customer allowing him to select the nodes that are to be developed (the customer regularly sends it his position). In this case, the server manages both the selection of nodes for development, and data transmission. This mode allows the customer workload to be lightened, but is not conceivable in the case of a large number of connected customers.

Depending on the type of use envisaged, allowing the connection of a more or less large number of customers, the PULL or PUSH mode will be used.

4.6 Selection of Nodes for Development

To determine which node is to be developed as a priority at the customer end, it is necessary to determine a refinement criterion. To do this we shall compare two cost functions, one taking account of perception criteria (distance from the object to the viewpoint, velocity of the viewpoint, etc.), the other criteria of fidelity between the refined model and the original model (difference in volume, comparison of the projection of the two models, etc.).

Figure 6:
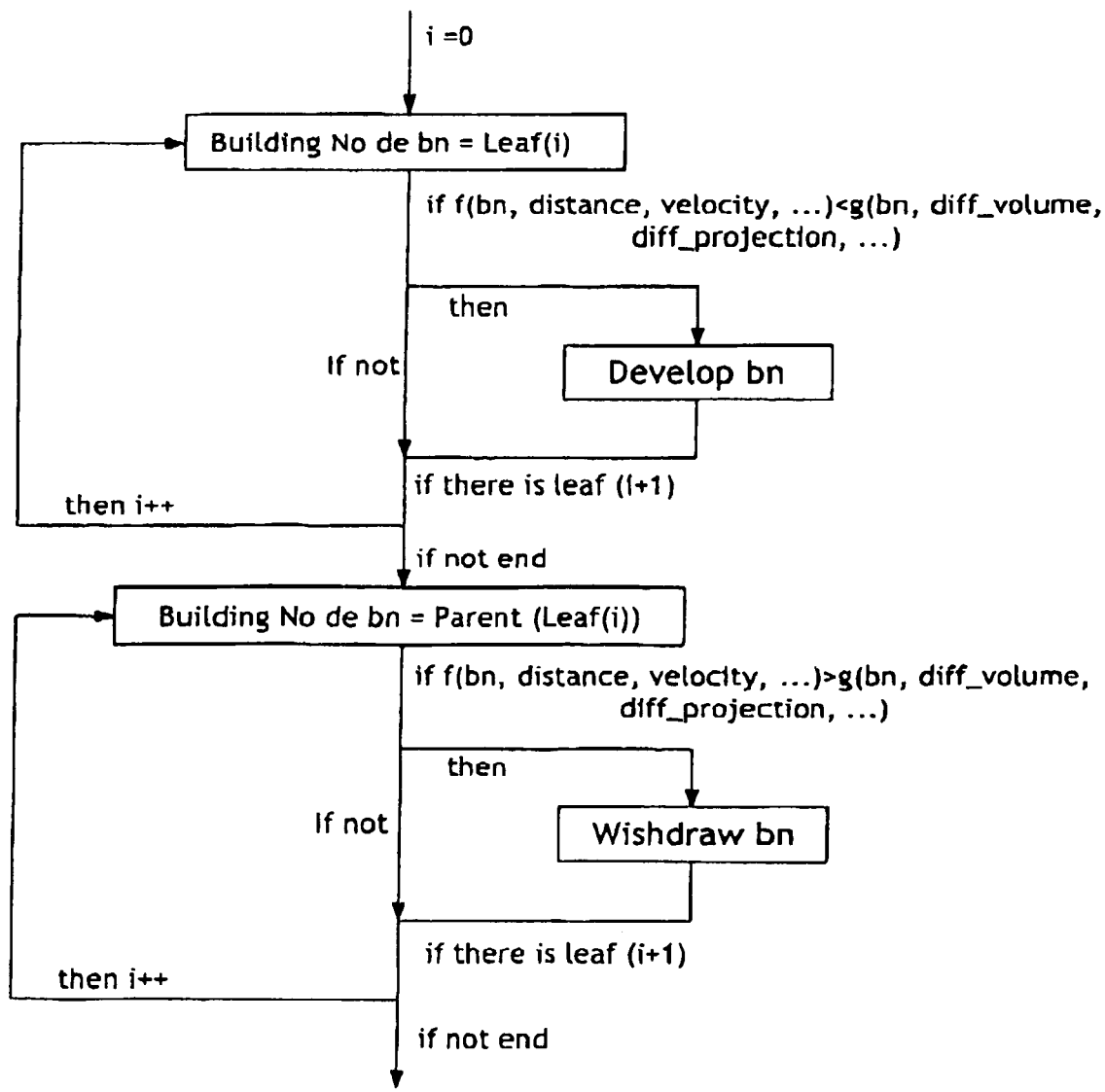
FIG. 6 shows an algorithm for selecting the nodes to be visualised.

In FIG. 6, f represents the function associated with the perception criteria taking as parameters the current node (bn), the distance from the current node bn to the viewpoint (distance), the velocity of the viewpoint (velocity), and any other perception parameter. The function g associated with the fidelity criteria of the level of detail relative to the original model takes as parameters the difference in volume between the current building corresponding to the node bn and the original buildings which it represents (diff_volume), the difference between the projection of the current buildings and that of the original buildings (diff_projection), as well as any other parameter making it possible to make explicit the error due to this cruder representation in the form of levels of details.

4.7 Data Transmission

To develop a node of the building tree Bn, only the additional information allowing the son nodes Bni to be specified is necessary The new vertices: Most of the vertices constituting the son nodes Bni were already referenced in the node Bn. Only the coordinates of the new vertices will be transmitted to the customer.

The indices of the vertices: It is necessary, in order to specify the overall floor dimensions of the buildings of the sons of Bn, to transmit the indices of the vertices of which they consist.

The reconstruction parameters: These parameters encompass all the necessary information allowing a more or less complex 3D model of the building to be obtained. These parameters include the altitude, the height of the building, the index of the texture of the facade, a roof type, a window type, etc.

4.7.1 Transmission of New Vertices

To transmit the coordinates of the new vertices, the centre of gravity cg of the overall floor dimensions of Bn is taken as a reference. The overall floor dimensions of the buildings in the city are provided to us with an accuracy e. For a vertex p, the pair (xp−xcp, yp−ycp) is therefore transmitted with an accuracy of e. Thus, if for the series of new vertices pi, we have:

$$\forall i,\ 2^{j+1} > MAX_i(MAX(I_{pi}-I_{cg}),\ MAX(y_{pi}-y_{cg}))/e > 2^j \qquad (10)$$

it is possible to encode the coordinates of the new vertices referenced relative to cg over j+1 bits.

4.7.2 Transmission of Indices of Vertices

In the case of a vertex already present in Bn, the index of the vertex in Bn is transmitted (its position in the polygon specifying the overall floor dimensions of Bn), otherwise, if a new vertex is involved, the index of the vertex is transmitted in the table of new vertices previously transmitted.

4.8 3-D Reconstruction and Visualisation 4.8.1 3-D Reconstruction

Simplistic reconstruction: The most simplistic reconstruction of a building is made by extrusion of its overall floor dimensions, from the altitude and the height of the building. A certain number of parameters allow the calculation of the facade texture coordinates, such as the real texture size, the number of storeys, the size of the ground floor, the number of windows to a storey. From these facade texture parameters, cutting and duplicating operations are performed in order to preserve a certain coherence when mapping the textures. For the roof textures, the texture is mapped from the ground (since the ground textures are aerial photos including both ground and the roofs).

Detailed reconstruction: To obtain a more complex building model, it is conceivable to calculate the skeleton of the overall floor dimensions of the building, thus allowing the roof to be reconstructed. A reconstruction of the windows is also conceivable, provided a grid has been transmitted specifying the location of the windows on the facade, as well as the corresponding 3D window model. Any type of procedural 3-D reconstruction method based on the overall floor dimensions of the building is conceivable.

4.8.2 Visualisation

The 3D rendering is carried out using the Open GL library. Only the leaves of the building tree for which a 3-D reconstruction has been carried out are transmitted to the graphics board, to be visualised. In the event of the graphics board becoming overloaded, implying rates of refreshment that are too low, some nodes of the building tree may be withdrawn so as to reduce the number of polygons to be visualised.

As far as very bulky terrain textures are concerned a progressive representation is used of the JPEG2000 type.

SUMMARY

As will have been understood, the method which has just been described is a new approach allowing the representation of modelled scenes from a series of prisms with different resolutions. The real purpose of this representation is to allow navigation in vast urban environments on a customer/server system. Using this method, navigation via the network is no longer only limited to navigation at ground level, but also allows overflying the city. To obtain this result, the algorithm merges and simplifies the prisms (or in our case, the buildings of the city) in order to generate several levels of detail of the scene. Given the automatic modelling techniques for urban scenes based on 2D½ data processing (video, photographs, cadastral map, etc), the algorithm processes only prisms or so-called 2D½ data (overall floor dimensions, height and altitude of the buildings) that is as comprehensive as a 3-D representation for the particular case of buildings in a city. From this pre-calculated representation of the buildings in the form of multi-scale prisms, the server will transmit progressively to the customer only the details that are actually perceptible in respect of the whole area seen from a certain viewpoint.

REFERENCES

[1] Jonathan Cohen, Amitabh Varshnay, Dinesh Manocha, Greg Turk, Hans Weber, Pankaj Agarwal, Frederick Brooks, and William Wright. Simplification envelopes. *SIGGRAPH 96 Conference Proceedings*, pp 119–128, 1996.

[2] X. Decoret, G. Schaufler, F. Sillon, and J. Dorsey. Multi-Layered impostors for accelerated rendering. In *Eurographics 99*, vol 18, 1999.

[3] Michel Garland and Paul Heckbert. Surface simplification using quadric error metrics, *SIGGRAPH 97 Conference Proceedings*, pp 209–216, 1997. Michel Garland and Paul Heckbert. Simplifying surfaces with colour and texture using quadric error metrics. *IEEE Visualisation 98 Conference Proceedings*, 1998.

[5] H. Hoppe. View-dependent refinement of progressive meshes. In *Computer Graphics SIGGRAPH 97*, vol 31, pp 189–198, New York, 1997. ACM Press.

[6] Hugues Hoppe. Progressive meshes. *SIGGRAPH 96 Conference Proceedings, pp* 99–108, 1996.

[7] Hugues Hoppe. New quadric metric for simplifying meshes with appearance attributes. *VISUALISATION 99 Conference Proceedings,* 1999. http://research.microsoft-.com/-hoppe/.

[8] D. Luebke and C. Erikson. View-dependent simplification of arbitrary polygonal environments. In *Computer Graphics SIGGRAPH 97*, vol 31, pp 199–208, New York, 1997. ACM Press.

[9] Y. I. H. Parish and P. Müller. Procedural modeling of cities. In *Computer Graphics, SIGGRAPH 2001*, pp 301–308. ACM Press, 2001.

[10] H. Pfister, M. Zwicker, J. Van Baar, and M. Gross. Surfels: Surface elements as rendering primitives. In *Computer Graphics, SIGGRAPH 2000 Proceeding*, pp 343–352, Los Angeles, 2000.

[11] William J. Schroeder, Jonathan A. Zarge, and William E. Lorensen. Decimation of triangle meshes. In *Proceedings of the 19th annual conference on Computer graphics and interactive techniques*, pp 65–70. ACM Press, 1992.

[12] Seth J. Teller and Carlo H. Sequin. Visibility preprocessing for interactive walkthroughs. *Computer Graphics (proceedings of SIGGRAPH 91)*, 25 (4): 61–69, 1991.

[13] S. Volz and M. Sester. Nexus—distributed data management concepts for location aware applications. In *International Workshop on emerging technologies for geo-based applications*, Ascona, Switzerland, 2000.

[14] Michael Wimmer, Peter Wonka, and Francois Sillion. Point-based impostors for real-time visualisation. In *EuroGraphics Workshop on Rendering,* 2001.

[15] P. Wonka and D. Scmalstieg. Occluder shadows for fast walkthroughs of urban environments. In *EUROGRAPHICS 99*, vol 18, 1999.

[16] Peter Wonka, Michael Wimmer and F. X. Sillion. Instant visibility. In *EuroGraphics 2001*, volume 20, 2001.

[17] Peter Wonka, Michael Wimmer and Dieter Schmasteig. Visibility pre-processing with occluder fusion for urban walkthroughs. In *Eurographics Workshop on Rendering,* 2000.

The invention claimed is:

1. Process for managing the representation of at least one model of a scene including buildings intended to be transmitted by storage means to a client, said scene being modelled by a multi-scale tree-structured representation, in which different nodes are associated with the different levels of details of the scene, these different nodes being dependent on each other in a tree structure in which at least one son node is defined by informations known by a father node and by additional informations, the informations stored by the storage means in respect of the son node being these additional informations, characterised in that a processing operation to simplify the representation is applied to the at least one model of the scene and in that priorities for implementing the simplification processing operations are determined by determining a cost function which takes account of the criterion of the difference in height of the merged buildings, wherein the cost function determines the priorities of implementation of simplification processing operations additionally takes account of the following criteria:

the difference in altitude of the merged buildings,
the additional surface area generated by the merging,
the minimum distance between the merged buildings.

2. Process according to claim 1, characterised in that the representation informations of the modelled scene are transmitted progressively by the storage means to the client.

3. Process according to one of claim 1 or 2, characterised in that the scene represented is that of a town and of its buildings.

4. Process according to claim 1, characterised in that each node comprises the following information:

a reference,
an overall floor dimension,
a height,
an altitude,
a roof type,
the references to the father node and the son nodes.

5. Process according to claim 1, characterised in that a reduction is implemented in the number of facades of a building observing the following constraints:

a single vertex is eliminated with each reduction in the number of facades of a building, and this vertex must not be shared by another overall floor dimension of a building, eliminating the vertex must not generate intersections between the simplified building and the neighbouring buildings, the area of the overall floor dimensions of the simplified building must be closest to the area of the overall floor dimensions of the original building.

6. Process according to claim 1, characterised in that a merging is implemented of buildings connected by one facade by merging the overall floor dimensions of two buildings, the height of the resulting building being an average of the height of the two buildings weighted by their respective surface areas, and the altitude being the minimum altitude of the two original buildings, thus ensuring that the building generated is mapped to the ground.

7. Process according to one of claim 1, characterised in that a processing operation is implemented to merge unconnected buildings.

8. Process according to claim 7, characterised in that in order to potentially merge buildings unconnected by an edge, a triangulation is made in the empty space without a Steiner point.

9. Process according to claim 1, characterised in that the representation of at least one model of a scene is transmitted by the storage means to the client in "Pull" mode: the customer himself deciding on the nodes that are to be developed and sending a request to said means, for the latter to provide him with the information necessary to develop the node.

10. Process according to claim 1, characterised in that the representation of at least one model of a scene is transmitted by the storage means to the client in "Push" mode, said means preserving the context of each client allowing him to select the nodes that are to be developed.

11. Customer/server system, characterised in that it comprises a server which includes processing means in order to implement a process according to claim 1.

* * * * *